US010859602B2

(12) United States Patent
Namburi et al.

(10) Patent No.: US 10,859,602 B2
(45) Date of Patent: Dec. 8, 2020

(54) TRANSFERRING ELECTRONIC PROBE ASSEMBLIES TO SPACE TRANSFORMERS

(71) Applicant: ADVANTEST CORPORATION, Tokyo (JP)

(72) Inventors: Lakshmikanth Namburi, Arcadia, CA (US); Florent Cros, Los Angeles, CA (US)

(*) Notice: Subject to any disclaimer, the term of this patent is extended or adjusted under 35 U.S.C. 154(b) by 336 days.

(21) Appl. No.: 13/788,388

(22) Filed: Mar. 7, 2013

(65) Prior Publication Data
US 2013/0234748 A1 Sep. 12, 2013

Related U.S. Application Data

(60) Provisional application No. 61/607,889, filed on Mar. 7, 2012.

(51) Int. Cl.
| | | |
|---|---|---|
| *G01R 3/00* | (2006.01) | |
| *H05K 3/40* | (2006.01) | |
| *G01R 1/073* | (2006.01) | |

(52) U.S. Cl.
CPC .......... *G01R 3/00* (2013.01); *G01R 1/07378* (2013.01); *Y10T 29/49117* (2015.01)

(58) Field of Classification Search
CPC ........ Y10T 29/49222; Y10T 29/49117; H05K 3/4092; H05K 3/4007; H05K 3/40; G01R 3/00; G01R 1/07378
USPC .......... 29/884, 874, 876, 825, 829, 842, 846
See application file for complete search history.

(56) References Cited

U.S. PATENT DOCUMENTS

| | | | | |
|---|---|---|---|---|
| 4,576,834 A | * | 3/1986 | Sobczak | ............... H01L 21/316 438/431 |
| 6,336,269 B1 | * | 1/2002 | Eldridge | ............... B23K 20/004 228/180.5 |
| 6,511,742 B1 | * | 1/2003 | Mussig | ................... B32B 27/00 428/343 |
| 6,520,778 B1 | * | 2/2003 | Eldridge | ........... H01L 21/67288 257/E23.021 |

(Continued)

FOREIGN PATENT DOCUMENTS

| | | |
|---|---|---|
| KR | 10-2009-0024559 | 3/2009 |
| KR | 10-2009-0085726 | 8/2009 |
| KR | 10-20090110461 | 10/2009 |

*Primary Examiner* — Peter Dungba Vo
*Assistant Examiner* — Kaying Kue
(74) *Attorney, Agent, or Firm* — Lumen Patent Firm

(57) ABSTRACT

Transferring electronic probe assemblies to space transformers. In accordance with a first method embodiment, a plurality of probes is formed in a sacrificial material on a sacrificial substrate via microelectromechanical systems (MEMS) processes. The tips of the plurality of probes are formed adjacent to the sacrificial substrate and the remaining structure of the plurality of probes extends outward from the sacrificial substrate. The sacrificial material comprising the plurality of probes is attached to a space transformer. The space transformer includes a plurality of contacts on one surface for contacting the plurality of probes at a probe pitch and a corresponding second plurality of contacts on another surface at a second pitch, larger than the probe pitch, wherein each of the second plurality of contacts is electrically coupled to a corresponding one of the plurality of probes. The sacrificial substrate is removed, and the sacrificial material is removed, leaving the plurality of probes intact.

12 Claims, 8 Drawing Sheets

(56) References Cited

U.S. PATENT DOCUMENTS

| | | | |
|---|---|---|---|
| 6,672,875 B1* | 1/2004 | Mathieu | G01R 1/06727 257/E23.078 |
| 7,081,624 B2* | 7/2006 | Liu | B82Y 10/00 250/306 |
| 7,084,650 B2* | 8/2006 | Cooper | G01R 3/00 324/750.25 |
| 7,271,022 B2 | 9/2007 | Tang et al. | |
| 7,271,602 B2 | 9/2007 | Tunaboylu et al. | |
| 7,273,812 B2* | 9/2007 | Kim | G01R 3/00 257/E21.159 |
| 7,363,705 B2* | 4/2008 | Kim | G01R 3/00 174/261 |
| 7,412,767 B2* | 8/2008 | Kim | G01R 1/0483 228/180.5 |
| 7,459,795 B2 | 12/2008 | Eldridge et al. | |
| 7,482,822 B2* | 1/2009 | Cooper | G01R 3/00 324/755.04 |
| 8,114,302 B2* | 2/2012 | Lee | G01R 1/06727 216/11 |
| 2004/0018752 A1* | 1/2004 | Lee | G01R 1/06733 439/43 |
| 2004/0104739 A1* | 6/2004 | Haga | C22C 19/03 324/755.05 |
| 2004/0113640 A1* | 6/2004 | Cooper | G01R 3/00 324/750.25 |
| 2004/0144301 A1* | 7/2004 | Neudeck | C30B 25/02 117/86 |
| 2005/0094412 A1 | 5/2005 | Henry | |
| 2005/0105159 A1* | 5/2005 | Paolini, Jr. | G02F 1/167 359/252 |
| 2005/0108875 A1* | 5/2005 | Mathieu | G01R 1/06711 29/852 |
| 2005/0221644 A1* | 10/2005 | Kim | G01R 1/0483 439/81 |
| 2006/0051948 A1* | 3/2006 | Kim | G01R 1/0483 438/597 |
| 2006/0208752 A1* | 9/2006 | Tanioka | G01R 1/07342 324/755.01 |
| 2006/0261827 A1* | 11/2006 | Cooper | G01R 3/00 324/755.04 |
| 2007/0089551 A1* | 4/2007 | Williams | G01R 1/06727 73/866.5 |
| 2007/0152685 A1 | 7/2007 | Eldridge et al. | |
| 2007/0217121 A1* | 9/2007 | Fu | A61N 1/3754 361/302 |
| 2008/0105355 A1* | 5/2008 | Kumar | G01R 3/00 156/60 |
| 2008/0157792 A1 | 7/2008 | Lee | |
| 2008/0186041 A1* | 8/2008 | Lee | G01R 1/07342 324/755.07 |
| 2009/0173712 A1* | 7/2009 | Lee | G01R 1/06727 216/11 |
| 2010/0176831 A1 | 7/2010 | Palcisko et al. | |
| 2012/0182035 A1* | 7/2012 | Rathburn | G01R 31/2889 324/754.03 |
| 2013/0045057 A1* | 2/2013 | Kojima | C23C 16/34 407/119 |

\* cited by examiner

200

900

1400

1400

TRANSFERRING ELECTRONIC PROBE ASSEMBLIES TO SPACE TRANSFORMERS

RELATED APPLICATIONS

This application claims priority to U.S. Provisional Patent Application 61/607,889, entitled, "Methods to Transfer Logic Probe Assemblies on to Space Transformers," filed 7 Mar. 2012, to Namburi and Cros, which is hereby incorporated herein by reference in its entirety.

Co-pending, commonly-owned U.S. patent application Ser. No. 13/788,241, entitled, "Fine Pitch Probe Array from Bulk Material," filed 7 Mar. 2013, to Namburi, is hereby incorporated herein in its entirety by reference.

U.S. Pat. No. 7,271,022, entitled "Process for Forming Microstructures," to Tang et al. is hereby incorporated herein in its entirety by reference.

FIELD OF INVENTION

Embodiments of the present invention relate to the field of integrated circuit design, manufacture and test. More specifically, embodiments of the present invention relate to systems and methods for transferring electronic probe assemblies to space transformers.

BACKGROUND

Integrated circuit testing generally utilizes fine probes to make contact with test points of an integrated circuit in order to inject electrical signals and/or measure electrical parameters of the integrated circuit. Conventional circuit probes are produced singly, and manually assembled into an array, sometimes known as or referred to as a "probe card," corresponding to some or all of the test points on an integrated circuit.

With increasing numbers of test points, and decreasing pad/bump spacing required of modern integrated circuits, it is challenging to assemble probes one at a time. Probe assemblies formed using surface micromachining techniques such as MEMS (microelectromechanical systems) or wire-EDM (electric discharge machining) are becoming attractive for probe cards. However, it is very difficult to build probe assemblies on top of a fine pitch space transformer such as a silicon space transformer, as the space transformers are quite complex and are very fragile. The stresses involved in building MEMS probes far exceed the strength of the fine pitch space transformers.

Most probe cards require repeated repair because probes are often damaged due to mishandling or are burned due to faulty die under test. Probes are generally replaced using a probe repair tool, a manual process that involves heating and un-mounting a damaged individual probe and reattaching a new probe. This is essential to restore the probe card to full functionality. However in the case of fine pitch probing with a pitch, e.g., probe to probe spacing, of less than about 50 µm, it is extremely difficult to replace individual probes. This is because of the small geometries and also due to insufficient clearance to handle the probe.

SUMMARY OF THE INVENTION

Therefore, what is needed are systems and methods for transferring electronic probe assemblies to space transformers. What is additionally needed are systems and methods transferring electronic probe assemblies to space transformers that eliminate manual assembly and reduce lead times. A further need exists for systems and methods for transferring electronic probe assemblies to space transformers that are compatible and complementary with existing systems and methods of integrated circuit design, manufacturing and test. Embodiments of the present invention provide these advantages.

In accordance with a first method embodiment, a plurality of probes is formed in a sacrificial material on a sacrificial substrate via microelectromechanical systems (MEMS) processes. The tips of the plurality of probes are formed adjacent to the sacrificial substrate and the remaining structure of the plurality of probes extends outward from the sacrificial substrate. The sacrificial material comprising the plurality of probes is attached to a space transformer. The space transformer includes a plurality of contacts on one surface for contacting the plurality of probes at a probe pitch and a corresponding second plurality of contacts on another surface at a second pitch, larger than the probe pitch, wherein each of the second plurality of contacts is electrically coupled to a corresponding one of the plurality of probes. The sacrificial substrate is removed, and the sacrificial material is removed, leaving the plurality of probes intact.

In accordance with a another embodiment, an article of manufacture includes a space transformer having first contacts at a first pitch on a first face, and second contacts at a second pitch on a second face and a fine pitch space transformer having third contacts at the second pitch on a first face and fourth contacts at a probe pitch on a second face. The first face of the fine pitch space transformer functionally coupled to the second contacts of the second face of the space transformer. The article also includes a plurality of fine pitch electronic probes, suitable for contacting test points of an integrated circuit, at a probe pitch functionally coupled to the fourth contacts of the second face of the fine pitch space transformer. The plurality of fine pitch electronic probes is configured to be removed as a whole from an assembly of the space transformer and the fine space transformer.

In accordance with another method embodiment of the present invention, a plurality of probes is formed in a primary sacrificial material on a sacrificial substrate via microelectromechanical systems (MEMS) processes. The tips of the plurality of probes are formed away from the sacrificial substrate and the remaining structure of the plurality of probes extends outward from the sacrificial substrate. The primary sacrificial material is removed. The plurality of probes is encapsulated in a secondary sacrificial material. The encapsulated plurality of probes is bonded to a space transformer, and the secondary sacrificial material is removed.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

DETAILED DESCRIPTION

Figure 1:
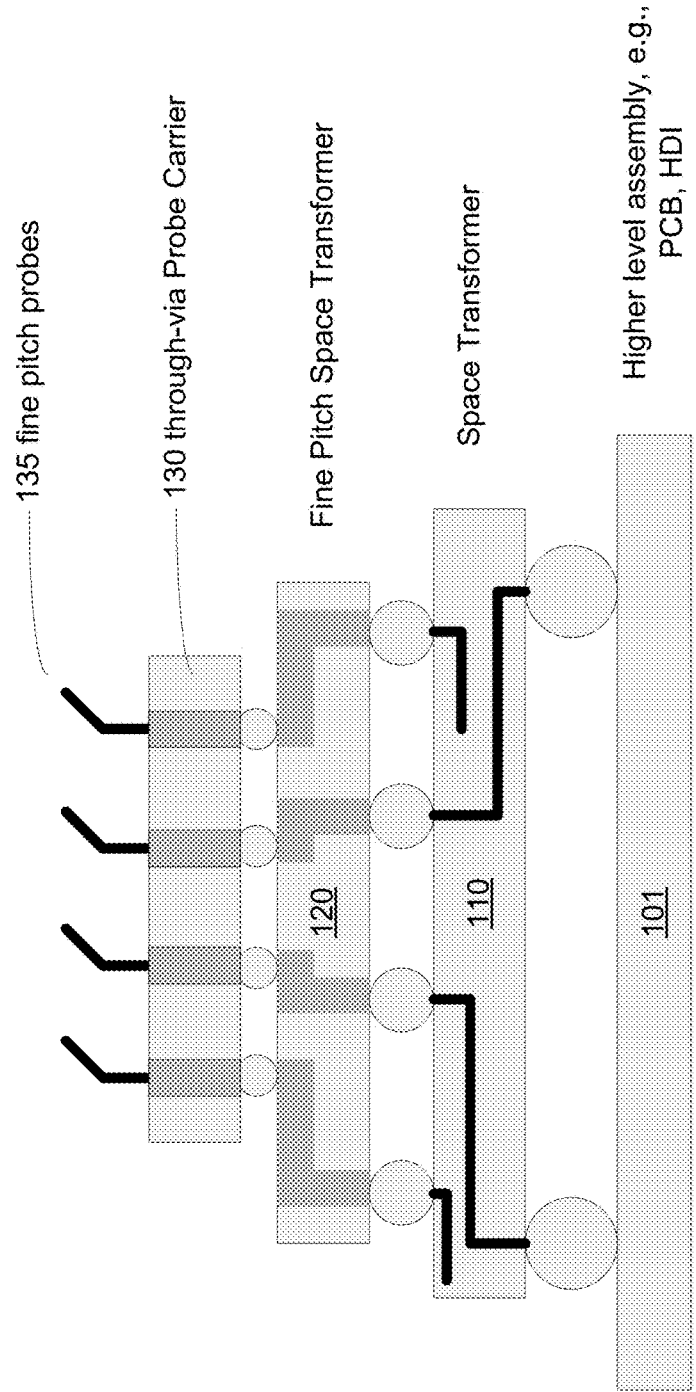
FIG. 1 illustrates an electronic probe assembly with space transformers 100, in accordance with embodiments of the present invention.

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

NOTATION AND NOMENCLATURE

Some portions of the detailed descriptions which follow (e.g., processes 200, 900, 1100 and 1400) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "accessing" or "forming" or "mounting" or "removing" or "encapsulating" or "bonding" or "releasing" or "coating" or "attaching" or "processing" or "singulating" or "roughening" or "filling" or "performing" or "generating" or "adjusting" or "creating" or "executing" or "continuing" or "indexing" or "computing" or "translating" or "calculating" or "determining" or "measuring" or "gathering" or "running" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Transferring Electronic Probe Assemblies to Space Transformers

FIG. 1 illustrates an electronic probe assembly with space transformers 100, in accordance with embodiments of the present invention. Electronic probe assembly 100 comprises a plurality, generally in an array, of fine pitch probes 135. The pitch, or probe to probe spacing, of the probes may be 50 µm or less. The fine pitch probes 135 may be mounted to, or formed on a through-via probe carrier 130.

Co-pending, commonly-owned U.S. patent application Ser. No. 13/788,241, filed 7 Mar. 2013, entitled, "Fine Pitch Probe Array from Bulk Material," to Namburi, illustrates systems and methods of such fine pitch probe arrays, and is incorporated herein in its entirety by reference. The disclosures of the referenced US Patent Application are compatible and complementary with the disclosures of the present application. It is appreciated that embodiments in accordance with the present application are also well suited to other formations of fine pitch probe arrays, e.g., microelectromechanical systems (MEMS).

The disclosures of U.S. Pat. No. 7,271,022, entitled "Process for Forming Microstructures," to Tang et al. incorporated herein in its entirety by reference, discloses forming microstructures on a substrate, e.g., via microelectromechanical systems (MEMS), that are compatible and complementary with the disclosures of the present application. For example, an exemplary MEMS process may comprise a repetitive process of plating a substrate, e.g., with a layer of copper (Cu) and, using photolithographic processes, etching a pattern in the copper and filling with patterned metal, e.g., a nickel-manganese (NiMn) alloy. In this manner a complex shape comprising a probe of nickel-manganese may be constructed.

The through-via probe carrier 130 is mounted to a fine pitch space transformer 120 by any suitable process utilizing any suitable materials, e.g., solder ball attachment. Fine pitch space transformer 120 changes, or transforms, the pitch of the fine pitch probes, e.g., a pitch of about 50 µm or less, to a larger pitch, e.g., in a range of about 50 µm to about 200 µm or larger.

The fine pitch space transformer 120 is mounted to a space transformer 110 by any suitable process utilizing any suitable materials, e.g., solder ball attachment. Space transformer 110 may comprise a low temperature co-fired ceramic (LTCC) or organic laminate, for example. Space transformer 110 changes, or transforms, the pitch of the fine pitch space transformer 120, e.g., from less (or equal) to about 50 µm to about 200 µm, to a larger pitch, e.g., about 400 µm or larger, suitable for a higher level electronic assembly.

The stack of space transformer 110, fine pitch space transformer 120 and the fine pitch probe array comprising through-via probe carrier 130 and fine pitch probes 135, are mounted on a higher level electronic assembly 101 by any suitable process comprising any suitable materials, e.g., solder balls. Higher level electronic assembly 101 may comprise, for example, a printed circuit board (PCB) and/or a high density interconnect (HDI) PCB Under the conventional art, when a probe is damaged or otherwise in need of replacement, a probe array and a space transformer generally must be replaced. In contrast, in accordance with embodiments of the present invention, only the probe array, comprising through-via probe carrier 130 and fine pitch probes 135, may be replaced. This beneficially reduces the rework required, resulting in advantageously reduced down time and decreased costs.

Figure 2:
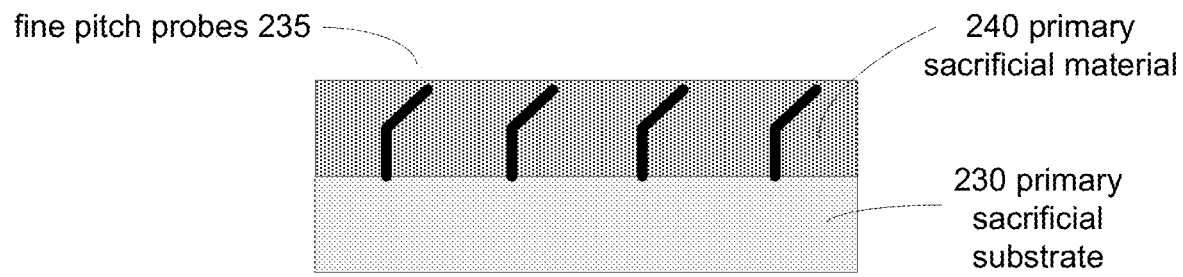
FIGS. 2, 3, 4, 5, 6, 7 and 8 illustrate a method of forming an electronic probe assembly, e.g., an electronic probe assembly, in accordance with embodiments of the present invention.

FIGS. 2 through 8 illustrate a method 200 of forming an electronic probe assembly, e.g., electronic probe assembly 100, in accordance with embodiments of the present invention. In FIG. 2, a plurality of fine pitch probes 235 are formed by microelectromechanical systems (MEMS) methods on a primary sacrificial substrate 230, e.g., a ceramic substrate. The fine pitch probes 235 are formed within a primary sacrificial material 240, e.g., copper (Cu). The fine pitch probes 235 are formed such that the probe tips, e.g., a portion of the probe designed to contact a test point of an integrated circuit, are formed away from the primary sacrificial substrate 230.

Figure 3:
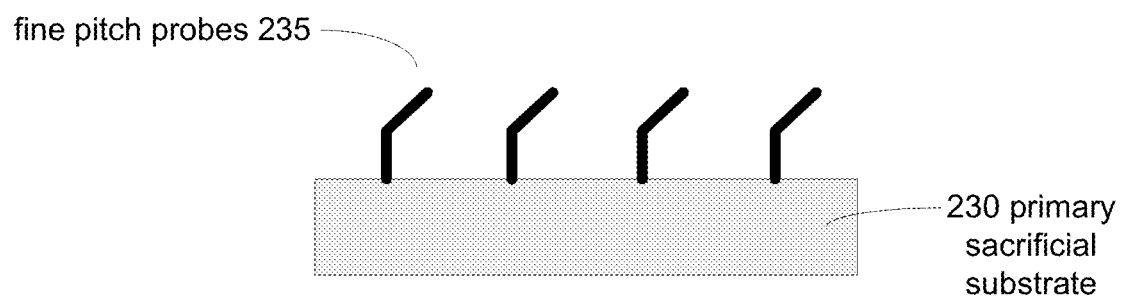

In general, the materials comprising primary sacrificial material 240, as used in the formation of the fine pitch probes 235, are not compatible with subsequent process operations. Accordingly, FIG. 3 illustrates release of the primary sacrificial material 240, in accordance with embodiments of the present invention. If the primary sacrificial material 240 is compatible with subsequent operations, the processes of FIGS. 3 and 4 (below) may not be necessary.

Figure 4:
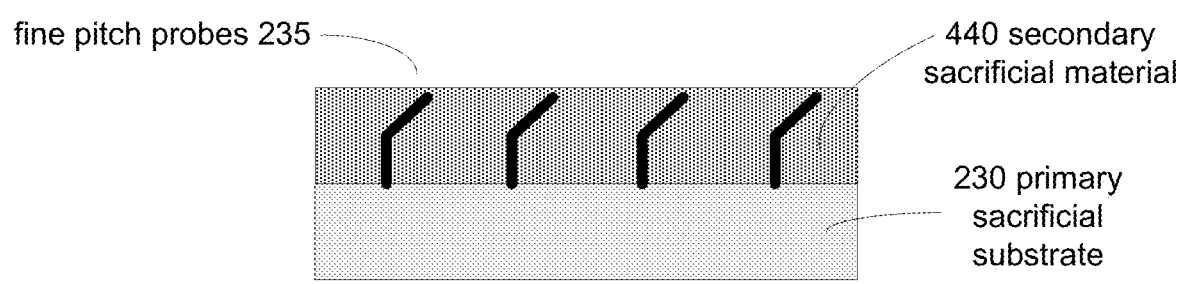
Figure 5:
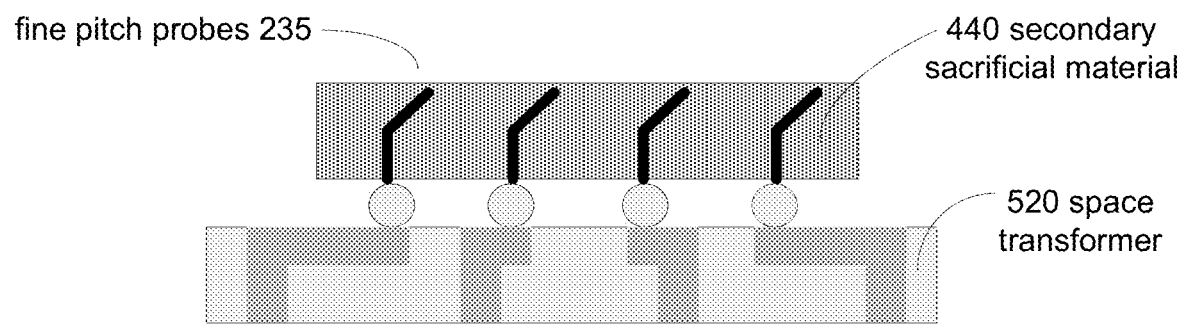

FIG. 4 illustrates encapsulating the fine pitch probes 235 with a secondary sacrificial material 440, in accordance with embodiments of the present invention. FIG. 5 illustrates bonding of the fine pitch probes 235 within secondary sacrificial material 440 to a space transformer 520, in accordance with embodiments of the present invention.

Figure 6:
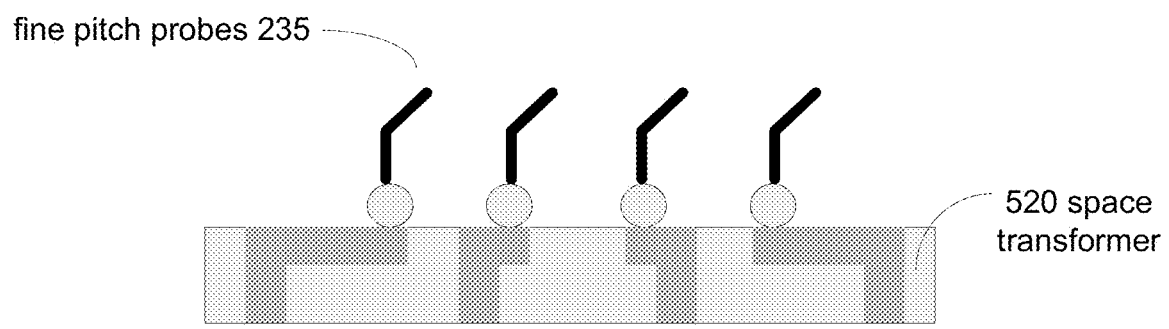

FIG. 6 illustrates removal of secondary sacrificial material 440, leaving a probe array comprising fine pitch probes 235 mounted to space transformer 520, in accordance with embodiments of the present invention.

Figure 7:
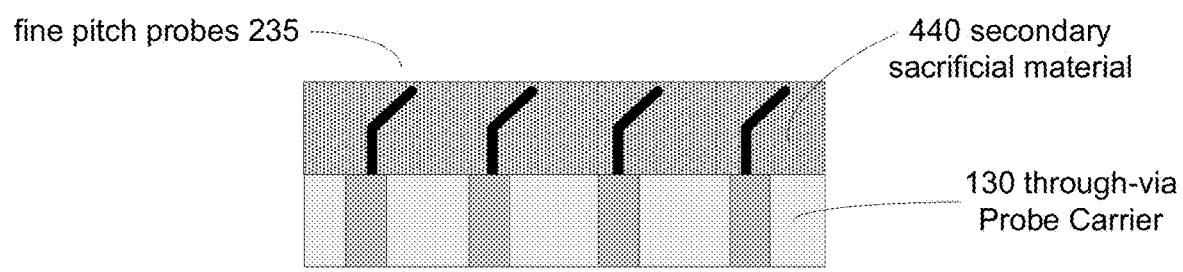
Figure 8:
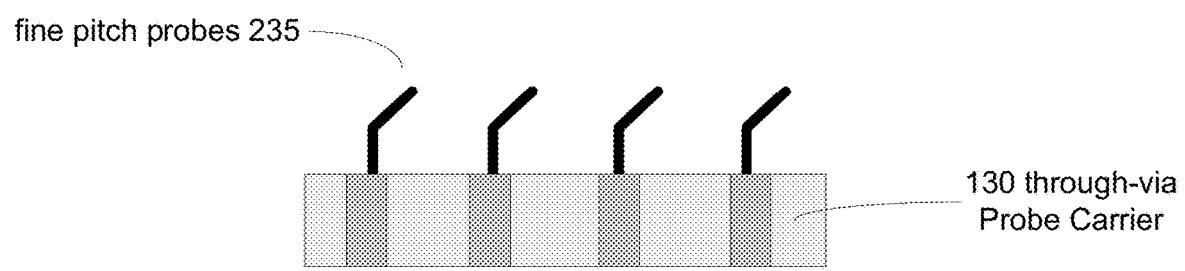

In an alternative embodiment, the fine pitch probes 235 within secondary sacrificial material 440 may be bonded to a through via probe carrier, e.g., through-via probe carrier 130, as illustrated in FIG. 1. FIG. 7 illustrates the fine pitch probes 235 within secondary sacrificial material 440 bonded to a through via probe carrier 130, in accordance with embodiments of the present invention. FIG. 8 illustrates removal of secondary sacrificial material 440, leaving a probe array comprising fine pitch probes 235 and through-via probe carrier 130, in accordance with embodiments of the present invention. The probe array may be coupled to other assemblies, e.g., as illustrated in FIG. 1.

Figure 9:
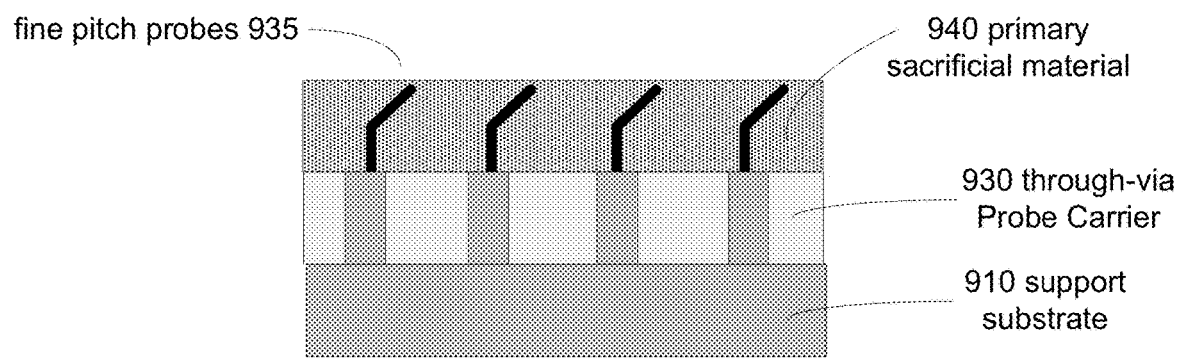
FIGS. 9 and 10 illustrate a method of forming an electronic probe assembly, e.g., an electronic probe assembly, in accordance with embodiments of the present invention.
Figure 10:
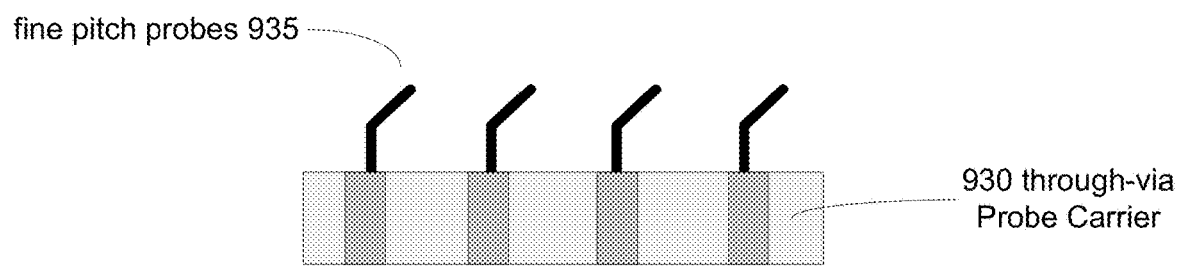

FIGS. 9 through 10 illustrate a method 900 for forming an electronic probe assembly, e.g., electronic probe assembly 100 (FIG. 1), in accordance with embodiments of the present invention. FIG. 9 illustrates fine pitch MEMS probes 935 in a primary sacrificial material 940 fabricated on top of a through via probe carrier substrate 930 attached to a support substrate 910 using a temporary adhesive, in accordance with embodiments of the present invention. The support substrate 910 provides the mechanical strength to run it through a microelectromechanical systems (MEMS) fabrication process.

After the completion of microelectromechanical systems (MEMS) fabrication process, the support substrate 910 is debonded and the primary sacrificial material 940 is released, in accordance with embodiments of the present invention, and as illustrated in FIG. 10. The probe array, comprising fine pitch probes 935 and through-via probe carrier 930 may be coupled to other assemblies, e.g., as illustrated in FIG. 1.

Figure 11:
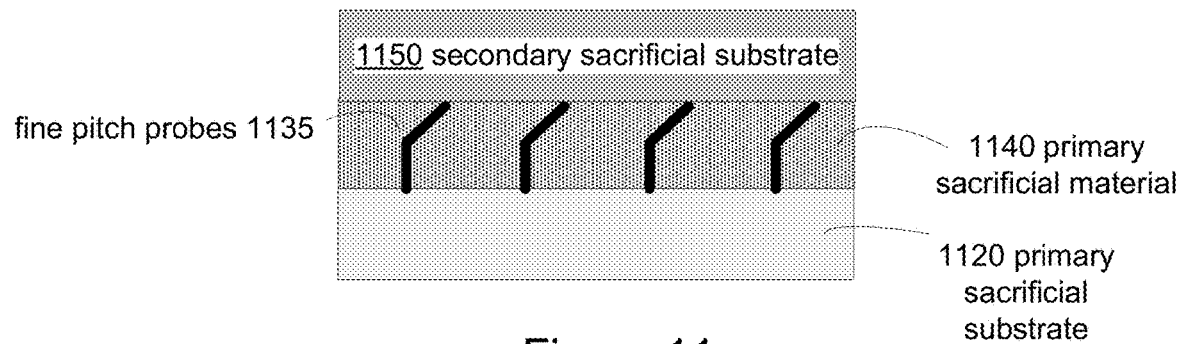
FIGS. 11, 12 and 13 illustrate a method of forming an electronic probe assembly, e.g., an electronic probe assembly, in accordance with embodiments of the present invention.
Figure 12:
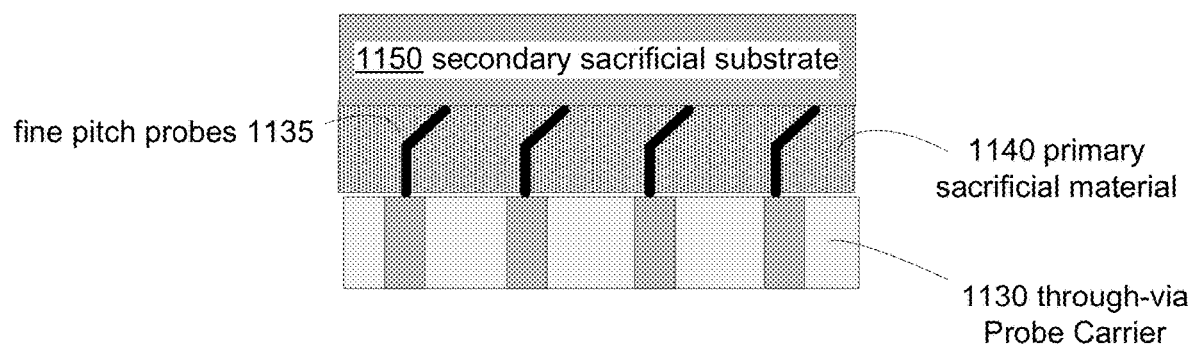
Figure 13:
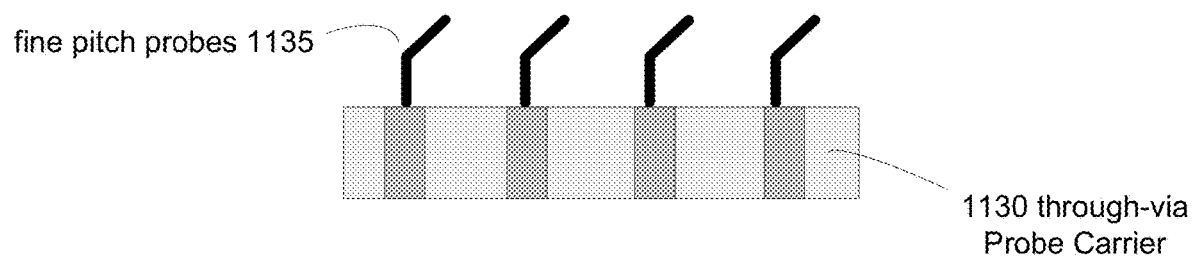

Method 1100, illustrated in FIGS. 11 through 13, comprises attaching a secondary sacrificial substrate on top of fine pitch probes while covered in primary sacrificial material. The secondary sacrificial substrate serves as a handle to hold the fine pitch probes. The primary sacrificial substrate is released where by the probe feet are freed for attachment to a space transformer either directly or using a through-via probe carrier substrate in between. The secondary sacrificial substrate and primary sacrificial material are subsequently released.

In accordance with embodiments of the present invention, FIG. 11 illustrates fine pitch probes 1135, formed within primary sacrificial material 1140, attached to a primary sacrificial substrate 1120, and bonded to a secondary sacrificial substrate 1150 on the top, or "probe tip" end of the fine pitch probes 1135.

In FIG. 12, the primary sacrificial substrate 1120 is released, and the remaining assembly, comprising fine pitch probes 1135 and secondary sacrificial substrate 1150, is aligned and bonded to a through via probe carrier 1130 using any suitable materials and processes, e.g., soldering, in accordance with embodiments of the present invention.

FIG. 13 illustrates the release of secondary sacrificial substrate 1150 and removal of the primary sacrificial material 1140, in accordance with embodiments of the present invention. The probe array, comprising fine pitch probes 1135 and through-via probe carrier 1130, may be coupled to other assemblies, e.g., as illustrated in FIG. 1.

Figure 14:
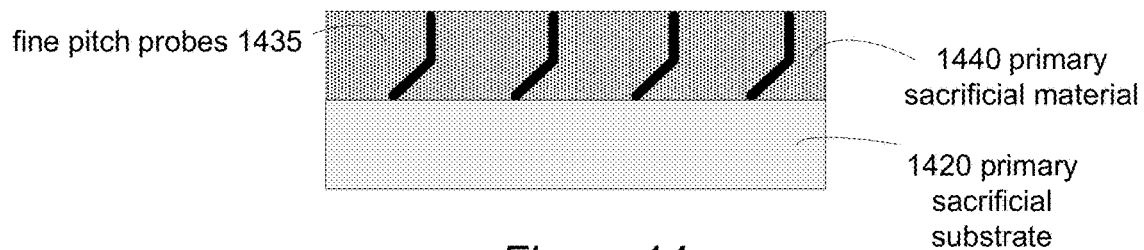
FIGS. 14, 15, 16, 17 and 18 illustrate a method of forming an electronic probe assembly, e.g., an electronic probe assembly, in accordance with embodiments of the present invention.

FIGS. 14 through 18 illustrate a method 1400 for forming an electronic probe assembly, e.g., electronic probe assembly 100 (FIG. 1), in accordance with embodiments of the present invention. In FIG. 14, a plurality of fine pitch probes 1435 are formed in a primary sacrificial material 1440 on a primary sacrificial substrate 1420, in accordance with embodiments of the present invention. It is to be appreciated that the fine pitch probes 1435 are formed "upside down" relative to previous Figures, for example, fine pitch probes 235 of FIG. 2. For example, the tips of fine pitch probes 1435, e.g., the portion of the probe designed to contact a test point of an integrated circuit, are formed next to the primary sacrificial substrate 1420.

Figure 15:
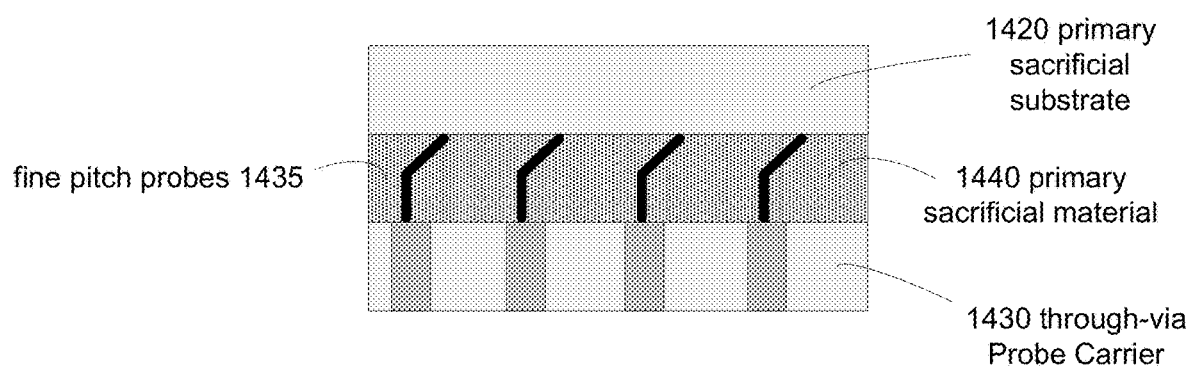

FIG. 15 illustrates mounting the assembly comprising fine pitch probes 1435, primary sacrificial material 1440 and primary sacrificial substrate 1420 onto a through-via probe carrier 1430, in accordance with embodiments of the present invention. It is to be appreciated that the base of the fine pitch probes 1435 are attached to the through-via probe carrier 1430.

Figure 16:
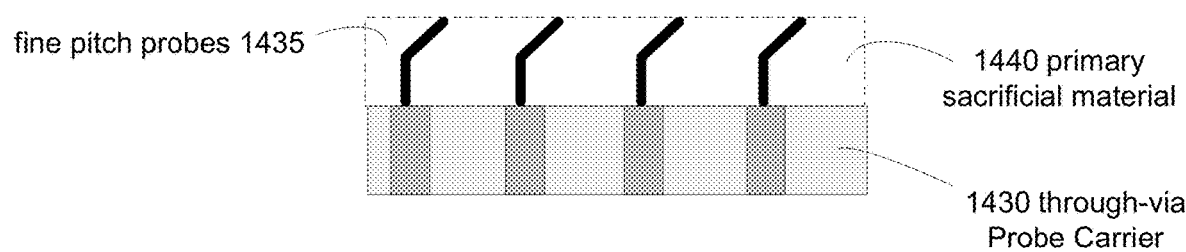

FIG. 16 illustrates removal of the primary sacrificial substrate 1420, in accordance with embodiments of the present invention. The primary sacrificial material 1440 may be removed by any suitable process, including chemical etching, for example. Primary sacrificial material 1440 may be removed proximate to the removal of sacrificial substrate 1420. However, in accordance with embodiments of the present invention, it may be beneficial to remove primary sacrificial substrate 1420 after additional processing, e.g., after attachment to a higher level assembly. The probe array, comprising fine pitch probes 1440 and through-via probe carrier 1430, may be coupled to other assemblies, e.g., as illustrated in FIG. 1.

Figure 17:
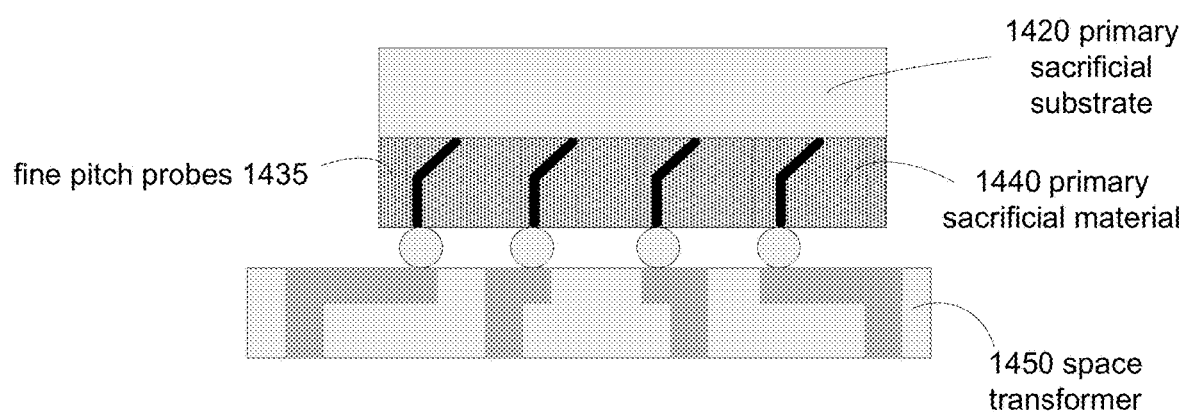

In an alternative embodiment, the fine pitch probes 1435, primary sacrificial material 1440 and primary sacrificial substrate 1420 may be mounted onto a space transformer 1450, in accordance with embodiments of the present invention. FIG. 17, proceeding from FIG. 14, illustrates mounting the assembly comprising fine pitch probes 1435, primary sacrificial material 1440 and primary sacrificial substrate 1420 onto a space transformer 1450, in accordance with embodiments of the present invention. It is to be appreciated that the bases of the fine pitch probes 1435 are attached to the space transformer 1450.

Figure 18:
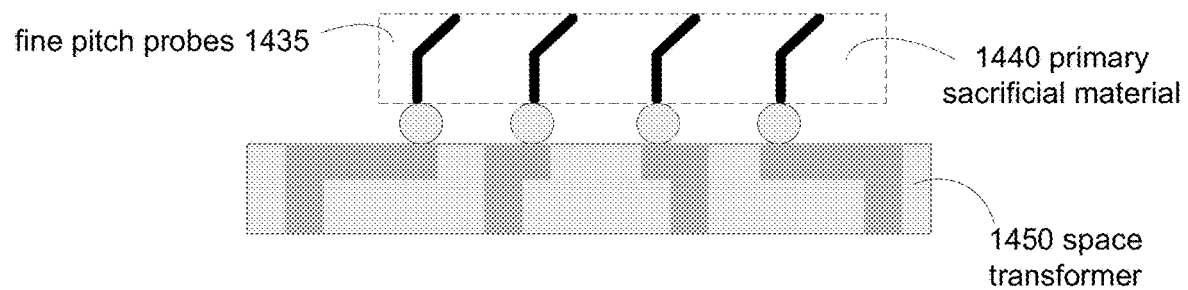

FIG. 18 illustrates removal of the primary sacrificial substrate 1420, in accordance with embodiments of the present invention. The primary sacrificial material 1440 may be removed by any suitable process, including chemical etching, for example. Primary sacrificial material 1440 may be removed proximate to the removal of sacrificial substrate 1420. However, in accordance with embodiments of the present invention, it may be beneficial to remove primary sacrificial substrate 1420 after additional processing, e.g., after attachment to a higher level assembly. The probe array, comprising fine pitch probes 1440 and space transformer 1450, may be coupled to other assemblies, e.g., as illustrated in FIG. 1.

Embodiments in accordance with the present invention provide systems and methods for transferring electronic probe assemblies to space transformers. In addition, embodiments in accordance with the present invention provide systems and methods for transferring electronic probe assemblies to space transformers that eliminate manual assembly and reduce lead times. Further, embodiments in accordance with the present invention provide systems and methods for transferring electronic probe assemblies to space transformers that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. A method comprising:
    forming a plurality of probes at a probe pitch, wherein each of said probes comprises a probe tip configured to contact an article under test, in an interior of a single sacrificial material on a sacrificial substrate via microelectromechanical systems (MEMS) processes,
    wherein all interfaces between said sacrificial material and said sacrificial substrate are planar,
    wherein said probe tips are formed adjacent to said sacrificial substrate and the remaining structure of said plurality of probes extends outward from said sacrificial substrate;
    removing said sacrificial substrate;
    subsequent to said removing said sacrificial substrate, attaching said sacrificial material comprising said plurality of probes to a through via substrate probe carrier having contacts at said probe pitch on both faces subsequent to said removing said sacrificial substrate, attaching said through via substrate probe carrier to a space transformer,
    wherein said space transformer comprises a plurality of contacts on one surface for contacting said plurality of probes at said probe pitch and a corresponding second plurality of contacts on another surface at a second pitch, larger than said probe pitch, wherein each of said second plurality of contacts is electrically coupled to a corresponding one of said plurality of probes; and
    removing said sacrificial material, while leaving said plurality of probes intact.

2. The method of claim 1 wherein said probe pitch is less than about 50 μm.

3. The method of claim 1 wherein said second pitch is at least twice said probe pitch.

4. The method of claim 1 wherein said plurality of probes comprise a nickel-manganese (NiMn) alloy.

5. The method of claim 1 wherein said sacrificial material comprises copper (Cu).

6. The method of claim 1 wherein said removing said sacrificial substrate and said removing said sacrificial material occur at about the same time.

7. A method comprising:
    providing a sacrificial substrate, then:
    forming a plurality of probes in an interior of a primary sacrificial material while disposed on said sacrificial substrate via microelectromechanical systems (MEMS) processes,
    wherein tips of said plurality of probes are configured to contact an article under test and are formed away from said sacrificial substrate and the remaining structure of said plurality of probes extends towards said sacrificial substrate;
    removing said primary sacrificial material from said plurality of probes and said sacrificial substrate;
    subsequent to said removing, encapsulating said plurality of probes in a secondary sacrificial material;
    bonding said encapsulated plurality of probes to a space transformer; and
    removing said secondary sacrificial material.

8. The method of claim 7 wherein said plurality of probes are at a pitch of less than or equal to about 50 μm.

9. The method of claim 7 wherein said space transformer comprises first contacts at said probe pitch on one face, and corresponding second contacts on another face at least twice said probe pitch, and wherein corresponding first and second contacts are electrically coupled.

10. The method of claim 7 wherein said plurality of probes comprise a nickel-manganese (NiMn) alloy.

11. The method of claim 7 wherein said primary sacrificial material comprises copper (Cu).

12. The method of claim 7 wherein said removing said secondary sacrificial material takes place subsequent to said bonding.

* * * * *